(12) United States Patent
Chen et al.

(10) Patent No.: US 10,700,683 B1
(45) Date of Patent: Jun. 30, 2020

(54) DYNAMIC POWER SUPPLY SHIFTING

(71) Applicant: QUALCOMM Incorporated, San Diego, CA (US)

(72) Inventors: Wilson Jianbo Chen, San Diego, CA (US); Chiew-Guan Tan, San Diego, CA (US); Sumit Rao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 75 days.

(21) Appl. No.: 16/114,524

(22) Filed: Aug. 28, 2018

(51) Int. Cl.
| | |
|---|---|
| *H03K 19/00* | (2006.01) |
| *H03K 5/08* | (2006.01) |
| *H03K 5/24* | (2006.01) |
| *H03K 19/003* | (2006.01) |
| *H03K 19/0185* | (2006.01) |
| *G06F 1/26* | (2006.01) |
| *H03K 3/3565* | (2006.01) |
| *H03K 17/10* | (2006.01) |

(52) U.S. Cl.
CPC ......... *H03K 19/00315* (2013.01); *G06F 1/26* (2013.01); *H03K 5/08* (2013.01); *H03K 5/24* (2013.01); *H03K 19/018507* (2013.01); *H03K 3/3565* (2013.01); *H03K 17/102* (2013.01)

(58) Field of Classification Search
CPC ...... H03K 19/00315; H03K 5/24; H03K 5/08; H03K 19/018507; H03K 17/102; H03K 3/3565; H03K 19/018521; H03K 19/017509; H03K 17/687; H03K 19/0013; H03K 19/0175; G06F 1/26; G11C 5/148
See application file for complete search history.

(56) References Cited

U.S. PATENT DOCUMENTS

| | | | |
|---|---|---|---|
| 5,966,026 A | 10/1999 | Partovi et al. | |
| 6,323,704 B1 | 11/2001 | Pelley et al. | |
| 6,525,607 B1 | 2/2003 | Liu | |
| 6,577,163 B1 | 6/2003 | Waldrip et al. | |
| 6,650,167 B1 | 11/2003 | Benzer et al. | |
| 6,819,137 B1 | 11/2004 | Wang et al. | |
| 6,879,198 B2 | 4/2005 | Kumar et al. | |
| 7,804,334 B2 | 9/2010 | Shankar et al. | |
| 7,816,948 B1 * | 10/2010 | Sanchez ......... | H03K 19/018507 326/63 |
| 7,825,607 B1 | 11/2010 | Huang et al. | |
| 7,884,646 B1 | 2/2011 | Bourstein | |
| 8,446,173 B1 * | 5/2013 | Faucher ........... | H03K 19/00361 326/27 |
| 8,482,329 B2 | 7/2013 | Deshpande et al. | |
| 8,680,891 B2 | 3/2014 | Srivastava et al. | |

(Continued)

FOREIGN PATENT DOCUMENTS

| | | |
|---|---|---|
| CN | 103546105 A | 1/2014 |
| EP | 0450406 A2 | 10/1991 |

(Continued)

*Primary Examiner* — Vibol Tan (74) *Attorney, Agent, or Firm* — Qualcomm Incorporated (57) ABSTRACT

Aspects generally relate to receivers, and in particular to a receiver that converts a high-voltage input signal into a low-voltage signal. The high voltage input signal is split into a upper portion and a lower portion. The upper portion is coupled to a high input receiver that is powered by dynamic supply shifters that can vary supply voltage during operation to optimize switching.

22 Claims, 8 Drawing Sheets

(56) References Cited

U.S. PATENT DOCUMENTS

| | | |
|---|---|---|
| 8,767,841 B1 | 7/2014 | Li et al. |
| 9,184,735 B1 | 11/2015 | Chen et al. |
| 9,329,609 B1 * | 5/2016 | Goyal .................. G05F 1/46 |
| 9,735,763 B1 | 8/2017 | Chen et al. |
| 2004/0075468 A1 | 4/2004 | Haskin |
| 2004/0110480 A1 | 6/2004 | Haskin |
| 2007/0176668 A1 | 8/2007 | Kimura |
| 2009/0261865 A1 | 10/2009 | Pasqualini |
| 2010/0321083 A1 * | 12/2010 | Chen ............. H03K 19/018521 327/333 |
| 2012/0194254 A1 | 8/2012 | Srivastava et al. |
| 2013/0293278 A1 | 11/2013 | Larsen et al. |
| 2016/0105182 A1 * | 4/2016 | Kerr ............... H03K 19/017509 326/80 |
| 2016/0105183 A1 | 4/2016 | Kim et al. |
| 2017/0041002 A1 | 2/2017 | Dey et al. |

FOREIGN PATENT DOCUMENTS

| | | |
|---|---|---|
| EP | 1742364 A2 | 1/2007 |
| JP | S55165006 A | 12/1980 |
| JP | H08265065 A | 10/1996 |
| JP | 2004192902 A | 7/2004 |
| JP | 2008161003 A | 7/2008 |
| JP | 2011004464 A | 1/2011 |
| JP | 2011188655 A | 9/2011 |
| JP | 2012014879 A | 1/2012 |

\* cited by examiner

DYNAMIC POWER SUPPLY SHIFTING

BACKGROUND

I. Field of the Disclosure

Aspects of the disclosure relate generally to receivers, and in particular to a receiver that converts a high-voltage input signal into a low-voltage signal.

II. Background

As semiconductor technology has advanced to smaller process nodes, the power supply voltage has also scaled down in concert with the scaling of transistor dimensions. Similarly, input/output (I/O) power supply voltage for I/O signals have also scaled down. Nevertheless, input/output (I/O) standards from signals with higher-voltage levels may still need to be supported. An integrated circuit (IC) may therefore need an input receiver that can receive input signals at a first voltage level and output signals at a second, lower, voltage level. Given the difference between various power supply voltages, devices in the input receiver may be stressed and malfunction if the voltage difference across their terminals (gate to source, gate to drain, or drain to source) exceeds a maximum rated voltage level for the device.

There is a need for mechanisms and methods to receive higher voltage signals and convert them to lower voltage signals.

SUMMARY OF THE DISCLOSURE

The described aspects generally relate to receivers, and in particular to a receiver that converts a high-voltage input signal into a low-voltage signal. In one embodiment, an input receiver receives a high power domain input signal from a high power domain powered by a high power supply voltage, wherein the input receiver is within a low power domain powered by a low power supply voltage. The receiver includes a waveform splitter configured to split the high power domain input signal into a high voltage signal that is greater than or equal to the low power supply voltage and into a low voltage signal that is less than or equal to the low power supply voltage, wherein the high power supply voltage is greater than the low power supply voltage. The receiver also includes a low voltage input receiver coupled to the low voltage signal, the low voltage input receiver powered by the low power supply voltage and ground. And, a high voltage input receiver coupled to the high voltage signal, the high voltage receiver powered by the high power supply voltage and the low power supply voltage. There is also a high voltage input receiver replica coupled to the high voltage signal, the high voltage input receiver replica powered by the high power supply voltage and low power supply voltage.

During operation, the high power supply voltage and low power supply voltage, of the high voltage receiver are lower voltage levels when an output of the low voltage input receiver goes high. Then the low power supply voltage, of the high voltage receiver is increased to the low power supply voltage level when an output of the high voltage input receiver goes high. And then the high power supply voltage, of the high voltage receiver, is increased to the high power supply voltage level when an output of the high voltage input receiver replica output goes high.

The high power domain can be an I/O power domain and the high power supply voltage can be an I/O power supply voltage, and wherein the low power domain can be a core power domain and the low power supply voltage can be a core power supply voltage. Also, the high power domain can be a first I/O power domain and the high power supply voltage can be a first I/O power supply voltage, and wherein the low power domain can be a second I/O power domain and the low power supply voltage can be a second I/O power supply voltage. In one embodiment, the high voltage input receiver includes an inverter including a PMOS transistor in series with an NMOS transistor, and wherein a source of the NMOS transistor is coupled to a low power supply node for supplying the low power supply voltage and wherein a source of the PMOS transistor is coupled to a high power supply node for supplying the high power supply voltage. In an embodiment, the low voltage input receiver includes an inverter including a PMOS transistor in series with an NMOS transistor, and wherein a source of the NMOS transistor is coupled to ground and wherein a source of the PMOS transistor is coupled to a low power supply node for supplying the low power supply voltage.

In another embodiment, an input receiver for receiving a high power domain input signal from a high power domain powered by a high power supply voltage, wherein the input receiver is within a low power domain powered by a low power supply voltage, includes a waveform splitter configured to split the high power domain input signal into a high voltage signal that is greater than or equal to the low power supply voltage and into a low voltage signal that is less than or equal to the low power supply voltage, wherein the high power supply voltage is greater than the low power supply voltage. There is a low voltage input receiver coupled to the low voltage signal, the low voltage input receiver powered by the low power supply voltage and ground. There is also a dynamic high power supply shifter coupled to the high voltage power supply voltage and configured to output a shifted high power supply voltage and a dynamic low power supply shifter coupled to the low voltage power supply voltage and configured to output a shifted low power supply voltage. The receiver includes a high voltage input receiver coupled to the high voltage signal, the high voltage receiver powered by the shifted high power supply voltage and the shifted low power supply voltage. There is also a high voltage input receiver replica coupled to the high voltage signal, the high voltage input receiver replica powered by the high power supply voltage and low power supply voltage.

During operation the shifted high power supply voltage and shifted low power supply voltage, of the high voltage receiver are lower voltage levels when an output of the low voltage input receiver goes high. The shifted low power supply voltage, of the high voltage receiver is increased to the low power supply voltage level when an output of the high voltage input receiver goes high. And, the shifted high power supply voltage, of the high voltage receiver, is increased to the high power supply voltage level when an output of the high voltage input receiver replica output goes high.

In an embodiment, the high power domain is an I/O power domain and the high power supply voltage is an I/O power supply voltage, and wherein the low power domain is a core power domain and the low power supply voltage is a core power supply voltage. In another embodiment, the high power domain is a first I/O power domain and the high power supply voltage is a first I/O power supply voltage, and wherein the low power domain is a second I/O power domain and the low power supply voltage is a second I/O power supply voltage.

In an embodiment, the high voltage input receiver includes an inverter including a PMOS transistor in series with an NMOS transistor, and wherein a source of the NMOS transistor is coupled to a low power supply node for supplying the low power supply voltage and wherein a source of the PMOS transistor is coupled to a high power supply node for supplying the high power supply voltage. In another embodiment, the low voltage input receiver includes an inverter including a PMOS transistor in series with an NMOS transistor, and wherein a source of the NMOS transistor is coupled to ground and wherein a source of the PMOS transistor is coupled to a low power supply node for supplying the low power supply voltage. In another embodiment, the dynamic high power supply shifter comprises a voltage divider. In yet another embodiment, the dynamic high power supply shifter and dynamic low power supply shifter can include multiple power supplies. In other embodiments, the dynamic low power supply shifter and dynamic high power supply shifter can include voltage dividers.

In an embodiment, a method of converting a high power domain input signal from a high power domain powered by a high power supply voltage into an output signal for a low power domain powered by a low power supply voltage includes splitting the high power domain input signal into a high voltage signal that cycles between the low power supply voltage and the high power supply voltage and into a low voltage signal that cycles no greater than the low power supply voltage, wherein the high power supply voltage is greater than the low power supply voltage. Coupling the low voltage signal to a low voltage input receiver, the low voltage receiver powered by the low power supply voltage and ground. Coupling the high voltage signal to a high voltage input receiver, the high voltage receiver powered by the high power supply voltage and the low power supply voltage. Adjusting the high power supply voltage and low power supply voltage, of the high voltage receiver, to lower voltage levels when an output of the low voltage input receiver goes high. Adjusting the low power supply voltage, of the high voltage receiver, to the low power supply voltage level when an output of the high voltage input receiver goes high. Adjusting the high power supply voltage, of the high voltage receiver, to the high power supply voltage level when an output of a high voltage input receiver replica output goes high, the high voltage input receiver replica coupled to the high voltage signal and powered by the high power supply voltage and low power supply voltage.

In an embodiment, the high power domain can be an I/O power domain and the high power supply voltage can be an I/O power supply voltage, and wherein the low power domain can be a core power domain and the low power supply voltage can be a core power supply voltage. In another embodiment, the high power domain can be a first I/O power domain and the high power supply voltage can be a first I/O power supply voltage, and wherein the low power domain can be a second I/O power domain and the low power supply voltage can be a second I/O power supply voltage. The low power supply voltage can be about half the level of the high power supply voltage. Adjusting the low and high power supply voltages can include a voltage dividers to lower a voltage.

An embodiment of an apparatus of converting a high power domain input signal from a high power domain powered by a high power supply voltage into an output signal for a low power domain powered by a low power supply voltage, includes means for splitting the high power domain input signal into a high voltage signal that cycles between the low power supply voltage and the high power supply voltage and into a low voltage signal that cycles no greater than the low power supply voltage, wherein the high power supply voltage is greater than the low power supply voltage. Also, means for coupling the low voltage signal to a low voltage input receiver, the low voltage receiver powered by the low power supply voltage and ground. And, means coupling the high voltage signal to a high voltage input receiver, the high voltage receiver powered by the high power supply voltage and the low power supply voltage. Also, means for adjusting the high power supply voltage and low power supply voltage, of the high voltage receiver, to lower voltage levels when an output of the low voltage input receiver goes high, And, means for adjusting the low power supply voltage, of the high voltage receiver, to the low power supply voltage level when an output of the high voltage input receiver goes high. Also means for adjusting the high power supply voltage, of the high voltage receiver, to the high power supply voltage level when an output of a high voltage input receiver replica output goes high, the high voltage input receiver replica coupled to the high voltage signal and powered by the high power supply voltage and low power supply voltage.

Various aspect and features of the disclosure are described in further detail below.

BRIEF DESCRIPTION OF THE FIGURES

The accompanying drawings are presented to aid in the description and illustrations of embodiments and are not intended to be limitations thereof.

DETAILED DESCRIPTION

Aspects disclosed in the following description and related drawings are directed to specific embodiments. Alternative embodiments may be devised without departing from the scope of the invention. Additionally, well-known elements may not be described in detail, or may be omitted, so as not to obscure relevant details. Embodiments disclosed may be suitably included in any electronic device.

With reference now to the drawing, several exemplary aspects of the present disclosure are described. The word "exemplary" is used herein to mean "serving as an example, instance, or illustration." Any aspect described herein as "exemplary" is not necessarily to be construed as preferred or advantageous over other aspects. Furthermore, the terminology used herein is for the purpose of describing particular embodiments and is not intended to be limiting As noted, ICs continue to advance to smaller and smaller process nodes and the maximum voltage transistors, at these smaller nodes, can be exposed to continues to decrease. But, I/O voltages continue to be relatively large, at least larger than the maximum voltage that transistors in the core of a device can withstand. So, when receiving a signal, such as a digital signal from an I/O pin the signal needs to be processed by low voltage devices within the IC and the low voltage devices can not be exposed to the high voltage I/O signal levels.

For example, an I/O signal can toggle between 3.3V and ground, but the devices within the IC core are only rated for a maximum of 1.8V. In other examples different voltage levels can be used for I/O and core. An aspect is that there is a higher voltage signal that needs to be processed by lower voltage devices.

An aspect is to "split" the I/O signal into multiple lower level signals, each lower level signal having a maximum voltage swing less than the maximum voltage of transistors within the device. For example, a 3.3V input signal can be split into a low signal that toggles between 0V and 1.65 V, and a high signal that toggles between 1.65V and 3.3V. The low signal can be coupled to devices powered by a 1.65V supply and 0V (ground). The high signal can be coupled to devices powered by a 3.3V supply and a 1.65V supply (virtual ground). While this "split" protects the devices from being exposed to voltage higher than their maximum rated value there can be a problem with a device switching at a desired voltage level. For example, a JEDEC standard for 3.3V receivers requires that an input high switching point (VIH) must be lower than 2V. In other words, a 3.3V receiver must output a high when the input signal is 2V or higher. Since an input signal of 2V would be in the high "split" signal, it is coupled to devices powered from 3.3V and 1.65V (virtual ground). The 2V signal only provides 350 mV headroom for the receiver device to switch, which may be less that a threshold voltage of a transistor in the device.

An aspect, as described below, is to dynamically shift the supply voltage of the devise coupled to the high "split" signal, so as to provide sufficient headroom that the receiver will meet the desired switching point. For example, during a low-to-high transition, the 3.3V and 1.65V (virtual ground) voltages can be lowered to a desired level, to have sufficient headroom, while not exceeding the maximum rated voltage of the devices. After switching has occurred the voltage levels and be returned to their original values of 3.3V and 1.65V (virtual ground) so the receiver can accept the full 3.3V input signal.

While the example above uses 3.3V and 1.65V as example voltage levels, theses are only example, other voltage levels can be used and still be within the scope of the disclosure. Likewise, different technologies, process nodes, and sizing of PMOS and NMOS transistors in devices can change the voltage levels, switching levels, and threshold levels in various ways, and still be within the scope of the disclosure.

As noted, an integrated circuit may need an input receiver that can receive input signals from a first I/O power domain to produce corresponding output signals for a second I/O power domain, or core power domain. A first I/O power supply voltage for the first I/O power domain is typically significantly higher than a second, intermediate voltage level, or I/O power supply voltage for the second I/O power domain or a core power supply voltage for the core power domain. Given the disparity between various power supply voltages, devices in the input receiver may be stressed and may malfunction if the voltage difference across their terminals (gate to source, gate to drain, or drain to source) exceeds the maximum power supply voltage for the devices. The following discussion will designate the high supply voltage for the high power domain as VDDPX, designate the intermediate voltage level, or low power supply voltage, for the low power domain as VDDIX, and the reference voltage, such as ground, as VSS.

Figure 1:
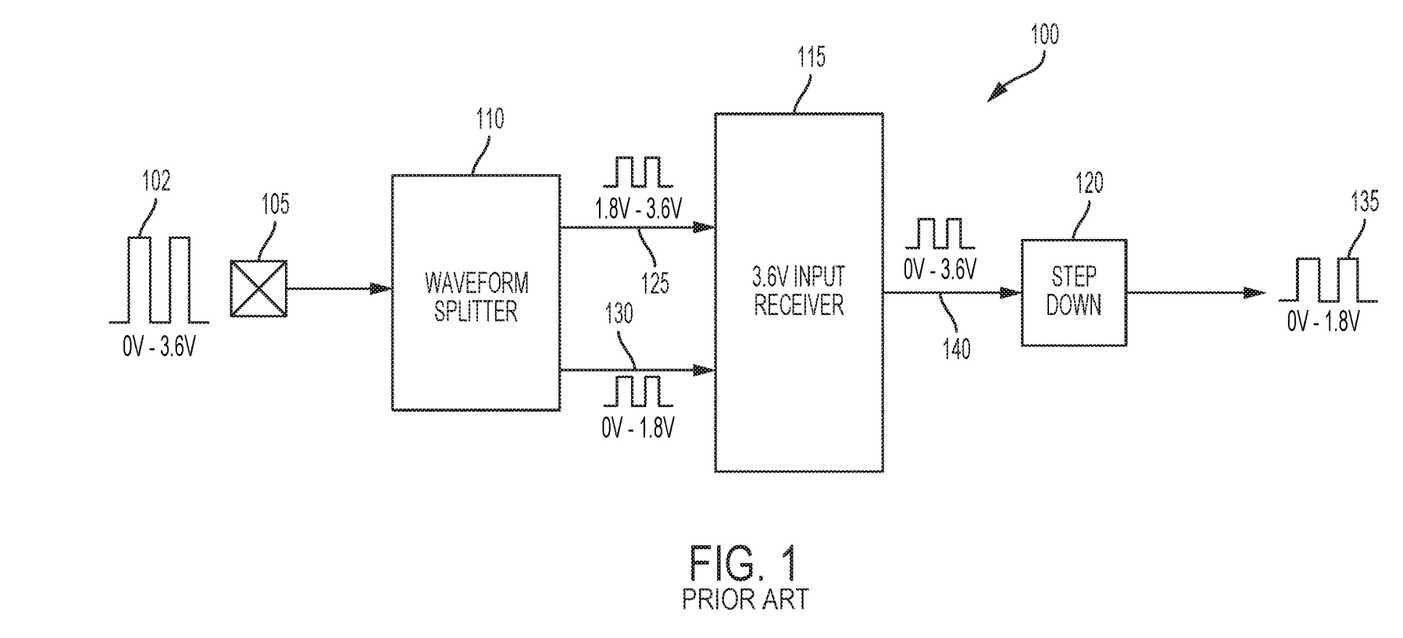
FIG. 1 is an example of a receiver circuit that can receive a high voltage signal and outputs a low voltage signal.

FIG. 1 is an example of a receiver circuit that can receive a high voltage signal, for example a signal that toggles between VSS (0V) to VDDPX, and outputs a low voltage signal, for example a signal that toggles between VSS (0V) to VDDIX. In this embodiment, the high power supply voltage VDDPX is 3.6V, the low power supply voltage VDDIX is 1.8V, and the reference voltage VSS is 0V (ground). In other embodiments, other voltage levels can be used for VDDPX, VDDIX, and VSS, for example, 3.3V, 1.65V, and others. A high power domain input signal 102 received at an input pad 105 cycles between VSS (0V) and VDDPX (3.6V). A waveform splitter 110 splits high power domain input signal 102 into an upper-half signal 125 and a lower-half signal 130. Upper-half signal 125 cycles between VDDIX (1.8V) and VDDPX (3.6V) whereas lower-half signal 130 cycles between VSS (0V) and VDDIX (1.8V). A single 3.6V input receiver 115 combines upper-half signal 125 and lower-half signal 130 to produce a combined signal 140 that cycles between VSS (0V) and VDDPX (3.6V). A voltage translator or step down circuit 120 translates combined signal 140 into a low power domain output signal 135 that cycles between VSS (0V) and VDDIX (1.8V).

Figure 2:
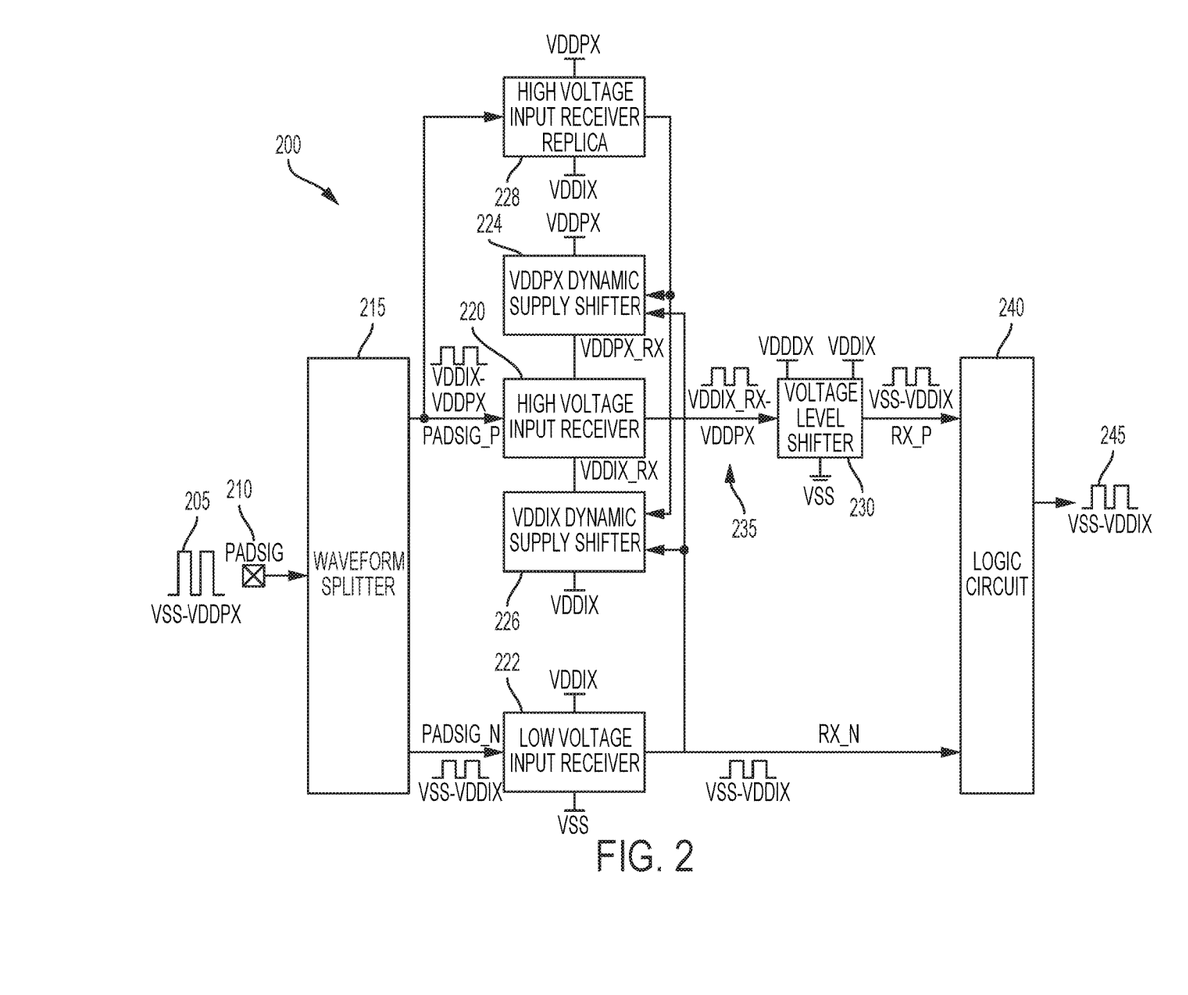
FIG. 2 is another example of a receiver circuit that can receive a high voltage signal and outputs a low voltage signal.

FIG. 2 is another example of a receiver circuit 200 that can receive a high voltage signal, for example a signal that toggles between VSS to VDDPX, and outputs a low voltage signal, for example a signal that toggles between VSS to VDDIX.

As shown in FIG. 2, high power domain input signal 205 that cycles between VSS (0V) and VDDPX is received on an input terminal (PADSIG) 210 of a waveform splitter 215. Waveform splitter 215 splits high power domain input signal 205 into an upper-half input signal (PADSIG_P) and a lower-half input signal (PADSIG_N). The PADSIG_P input signal from waveform splitter 215 cycles between VDDIX and VDDPX, and the PADSIG_N input signal from waveform splitter 215 cycles between VSS and VDDIX.

Figure 3:
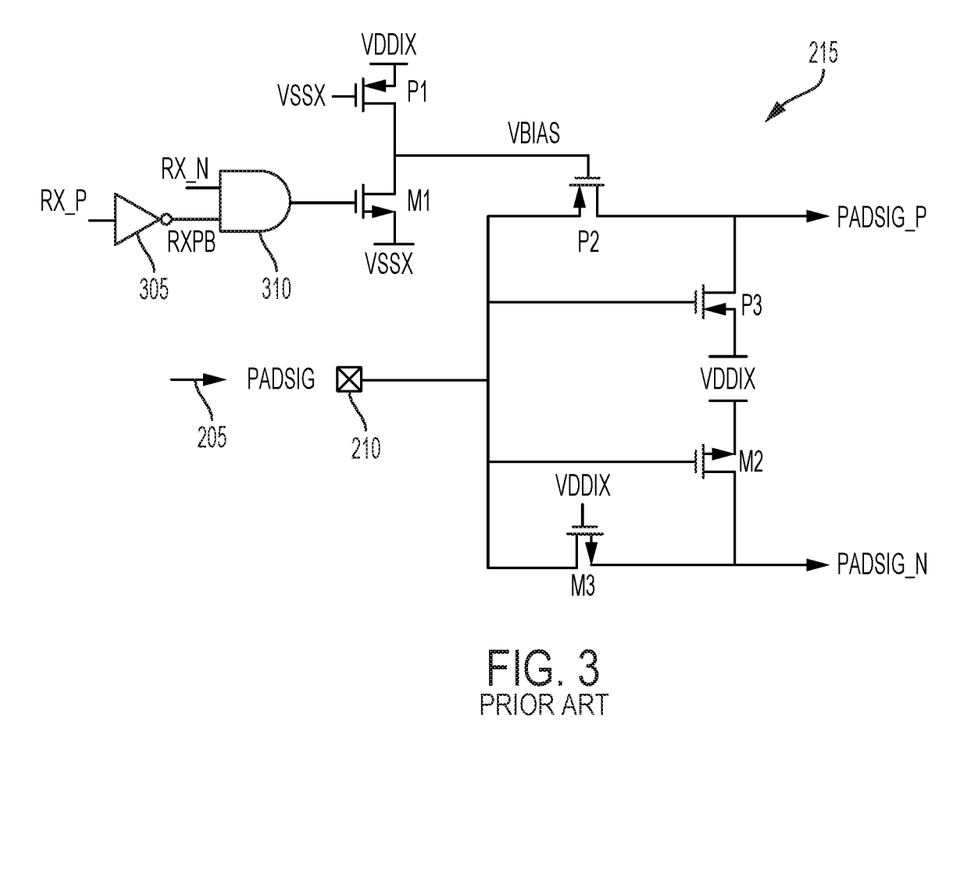
FIG. 3 is an example of a waveform splitter.

FIG. 3 is an example of a waveform splitter 215. As shown in FIG. 3, an NMOS pass transistor M3 has its gate biased by VDDIX and its drain tied to PADSIG input pad 210. High power domain input signal 205 will thus pass through pass transistor M3 as high power domain input signal 205 rises from VSS. An NMOS clamping transistor M2 also has its gate tied to PADSIG input pad 210. A source for clamping transistor M2 couples to the source for pass transistor M3 for producing the PADSIG_N input signal. The drain for clamping transistor M2 couples to a low power supply node supplying VDDIX. As high power domain input signal 205 rises above VDDIX, clamping transistor M2 thus clamps the PADSIG_N input signal at VDDIX. In this fashion, the PADSIGN_N input signal represents the bottom half of high power domain input signal 205 such that the PADSIG_N input signal substantially equals high power domain input signal 205 when high power domain input signal 205 is less than or equal to VDDIX and such that the PADSIG_N input signal is clamped at VDDIX when high power domain input signal 205 is greater than VDDIX.

A PMOS pass transistor P2 for producing the PADSIG_P signal has its source coupled to PADSIG input pad 210 and its drain coupled to a drain of a PMOS clamping transistor P3. The source of clamping transistor P3 is tied to the VDDIX power supply node. Clamping transistor P3 is thus switched on as high power domain input signal 205 drops below VDDIX to clamp the PADSIG_P input signal to VDDIX. The gate of pass transistor P2 could be biased to VDDIX analogously as discussed with regard to pass transistor M3. But the threshold voltage for pass transistor P2 would then introduce duty cycle distortion in the PADSIG_P input signal with regard to the rising edge of high power domain input signal 205. In particular, the PADSIG_P input signal would not begin to rise above VDDIX until high power domain input signal 205 has risen above VDDIX by the threshold voltage for pass transistor P2. To pass more of the rising edge of high power domain input signals 205 as it rises above VDDIX through pass transistor P2, the gate of pass transistor P2 is biased by a bias voltage VBIAS produced at the drain of an NMOS voltage divider transistor M1. The source of voltage divider transistor M1 couples to ground whereas its drain couples to the drain of a PMOS voltage divider transistor P1. The gate of voltage divider transistor P1 is grounded. Since the source of voltage divider transistor P1 is tied to a low power supply node supplying VDDIX, voltage divider transistor P1 is always on and attempting to bias VBIAS to VDDIX.

An AND gate 310 controls the gate voltage for voltage divider transistor M1. If the output of AND gate 310 is a binary zero, voltage divider transistor M1 is off such that voltage divider transistor P1 biases VBIAS to VDDIX. But if the output of AND gate 310 is asserted to VDDIX (a binary one), voltage divider transistor M1 switches on. Voltage divider transistor M1 is smaller than voltage divider transistor P1 such that voltage divider transistor M1 is more resistive than voltage divider transistor P1. The resulting voltage division by voltage divider transistors M1 and P1 thus pulls VBIAS below VDDIX by some fraction of VDDIX when the output of AND gate 310 is asserted high. Since voltage divider transistor M1 is more resistive than voltage divider P1, the fraction of VDDIX is less than one-half of VDDIX. AND gate 310 receives the RX_N (output of voltage level shifter 230 of FIG. 2, described below) input signal and a complement RXPB of the RX_P (output of low voltage input receiver 22 of FIG. 2, described below) input signal produced by an inverter 305. The output of AND gate 310 will thus go high when the RX_N input signal has transitioned to a binary one value but the RX_P input signal is still a binary zero. The bias voltage VBIAS will thus be lowered when the PADSIG_N input signal from waveform splitter 215 has passed the low threshold voltage of low voltage input receiver 222 (FIG. 2) but has not passed the high threshold voltage of high voltage input receiver 220 (FIG. 2). In this fashion, a rising edge of high power domain input signal 205 can pass through pass transistor P2 as high power domain input signal 205 rises from VDDIX to form a corresponding rising edge of the PADSIG_P input signal without suffering from a duty cycle distortion from the threshold voltage for pass transistor P2. In one embodiment, waveform splitter 215 may be deemed to comprise a means for splitting high power domain input signal 205 with regard to the bias voltage VBIAS into the PADSIG_P input signal that is greater than or equal to VDDIX and for splitting high power domain input signal 205 with regard to the VDDIX into the PADSIG_N input signal that is less than or equal to VDDIX.

Referring again to FIG. 2, a low voltage input receiver 222 compares the PADSIG_N input signal (the low voltage signal) to a low threshold voltage that is greater than VSS and less then VDDIX to produce a low power domain second input signal denoted herein as an RX_N input signal. A high voltage input receiver 220 compares the PADSIG_P input signal to a high threshold voltage that is greater than VDDIX and less than VDDPX to produce a received high voltage signal 235. Like the PADSIG_P input signal (the high voltage signal), received high voltage signal 235 cycles between VDDIX and VDDPX. Voltage level shifter 230 uses both the VDDPX and VDDIX power supply voltages to level shift received high voltage signal 235 by VDDIX into a low power domain first input signal denoted herein as an RX_P input signal.

Figure 4A:
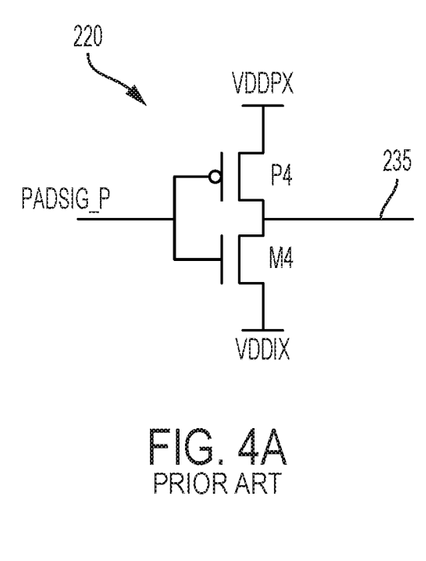
FIGS. 4A and 4B are diagrams for high and low voltage input receivers.
Figure 4B:
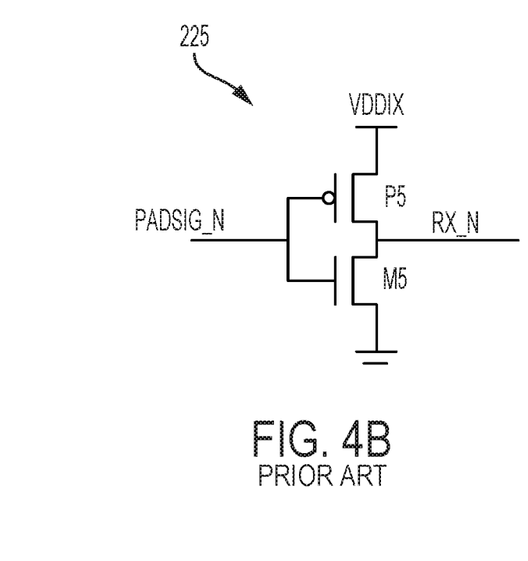

High voltage input receiver 220 and low voltage input receiver 222 may both be implemented using inverters. However, it will be appreciated that other suitable receivers such as a Schmitt trigger may be used to form high voltage input receiver 220 and low voltage input receiver 222. The following discussion will thus assume without loss of generality that receivers 220 and 222 are each formed using an inverter. A diagram for high voltage input receiver 220 is shown in FIG. 4A. The PADSIG_P input signal from waveform splitter 215 (FIG. 2) drives a gate of a PMOS transistor P4 and an NMOS transistor M4. The source of NMOS transistor M4 is coupled to a low power supply node supplying VDDIX and its drain is coupled to a drain of transistor P4. The source of transistor P4 is tied to an high power supply node supplying VDDPX. Received high voltage signal 235 is produced at the drains of transistors P4 and M4. The high threshold voltage for high voltage input receiver 220 will thus depend upon the relative strengths of transistors P4 and M4. Assuming equal strengths for these transistors, the high threshold voltage will thus equal (VDDPX−VDDIX)/2. Low voltage input receiver 222 may be constructed analogously as shown in FIG. 4B. The PADSIG_N input signal from waveform splitter 215 (FIG. 2) drives a gate of a PMOS transistor P5 and an NMOS transistor M5. The source of NMOS transistor M5 is coupled to ground and its drain is coupled to a drain of transistor P4. The source of transistor P5 is tied to a low power supply node supplying VDDIX. The RX_N input signal is produced at the drains of transistors P5 and M5. The low threshold voltage for low voltage input receiver 222 will thus depend upon the relative strengths of transistors P5 and M5. Assuming equal strengths for these transistors, the low threshold voltage will thus equal (VDDIX)/2. The high voltage threshold and low voltage threshold may thus be separated by VDDIX in some embodiments to provide a robust hysteresis range.

As noted, high voltage input receiver 220 operates between VDDPX and VDDIX (virtual ground) and low voltage receiver operates between VDDIX and VSS (Ground). Using a 3.3V receiver as an example, VDDPX will be at 3.3V while VDDIX will be 0.5*VDDPX=1.65V. According to a JEDEC specification for a 3.3V input receiver, the input low switching point (VIL) of the receiver must be higher than 0.8V, and the input high switching point (VIH) of the receiver must be lower than 2V.

Referring back to FIG. 4A, the high voltage input receiver 220 operates between VDDPX and VDDIX and its switching point will determine the VIH value. As noted, in the example of the 3.3V receiver, VDDIX will be 1.65V, and because VIH is required to be less than 2V, the NMOS M4 of the high voltage input receiver 220 will have less than 2V−1.65V=350 mV overdrive voltage to switch the output. Typical threshold voltage of an NMOS device, in some technologies, can be as high as 800 mV in some PVT corners of a manufacture process. For other process technologies the threshold voltage of devices can be other voltage levels. Because the threshold voltage of a typical NMOS device may be much larger than 350 mV, the VIH value of the receiver may be much higher than 2V, as required by the JEDEC specification.

To compensate for the low overdrive voltage, aspects include temporarily lowering the supply voltage levels applied to the high voltage input receiver 220 to provide additional headroom. Using, as an example, a device with a threshold voltage of 800 mV, one aspect would be to lower VDDIX to 1.2V to ensure the VIH value would less than 2V. To prevent exposing the device to a voltage level higher than its maximum voltage, VDDPX will also be temporarily lowed, for example, by the same amount to 2.85 V. Once the high voltage input receiver switches high, the voltage levels can return to their original values so the receiver can receive the full 3.3V input signal. Lowering, or shifting, the supply voltages only needs to be applied to the high voltage input receiver 220, because the low voltage input receiver has enough overdrive voltage for VIL. An additional aspect would be to disproportionally skew P/N ratio, that is vary the sizes of the PMOS and NMOS devices. Disproportionally skewing the P/N ratio may reduce the amount the voltages need to be reduced, or shifted, while still ensuring proper shifting. Additional, different technologies and process nodes will produce devices with different threshold voltage levels. Various combinations of technologies, process nodes, and P/N ratios can be used to select a desired amount of voltage to reduce the supplies of the high voltage input receiver.

Referring back to FIG. 2, the receiver 200 includes a VDDPX dynamic supply shifter 224, VDDIX dynamic supply shifter 228, and high voltage input receiver replica 228. In the example illustrated in FIG. 2, the power VDDPX and virtual ground VDDIX of the high voltage input receiver 220 are dynamically shifted during a low-to-high switching event at the input terminal (PADSIG) 210.

In the example of FIG. 2, the high voltage receiver 220 is not directly powered by VDDPX and VDDIX. Instead, both VDDPX and VDDIX go through their own dynamic supply shifter, 224 and 226 respectively, to generate two different power and virtual ground connection: VDDPX_RX and VDDIX_RX. As described below, at steady state (no switch activity) VDDPX_RX equals VDDPX and VDDIX_RX equals VDDIX. However, during a low-to-high switching event at PADSIG 210, both VDDPX_RX and VDDIX_RX are temporarily reduced, or shifted, to a lower voltage value to enable high voltage input receiver 220 to switch at a much lower input (PADSIG) voltage, thereby achieving a lower VIH switching point than the intrinsic switching point of the high voltage input receiver 220.

The dynamic supply shifters 224 and 226 receive input from the voltage input receiver replica 228 and low voltage input receiver 222 to control the dynamic supply shifters, 224 and 226, as described below. In another embodiment there can be dynamic supply shifting logic external to the dynamic supply shifters 224 and 226. The high voltage input receiver replica 228 is directly powered by VDDPX and VDDIX so that its actual switching point is guaranteed to be higher than the high voltage input receiver 220.

During a low-to-high transition at PADSIG 210, when the low voltage input receiver 222 output is high and high voltage input receiver replica 228 output is low, dynamic supply shifting is turned on for both VDDPX_RX and VDDIX_RX.

When the high voltage input receiver 220 output switches, the adjustment on the VDDIX dynamic supply shifter 226 output is adjusted to VDDIX. Then, when the high voltage input receiver replica 228 output switches high, VDDPX dynamic supply shifter 224 output is adjusted to VDDPX. The higher switching point in the high voltage input receiver replica 228 guarantees that the adjustment gets turned off only after the actual high voltage input receiver 220 output has switched.

Figure 5:
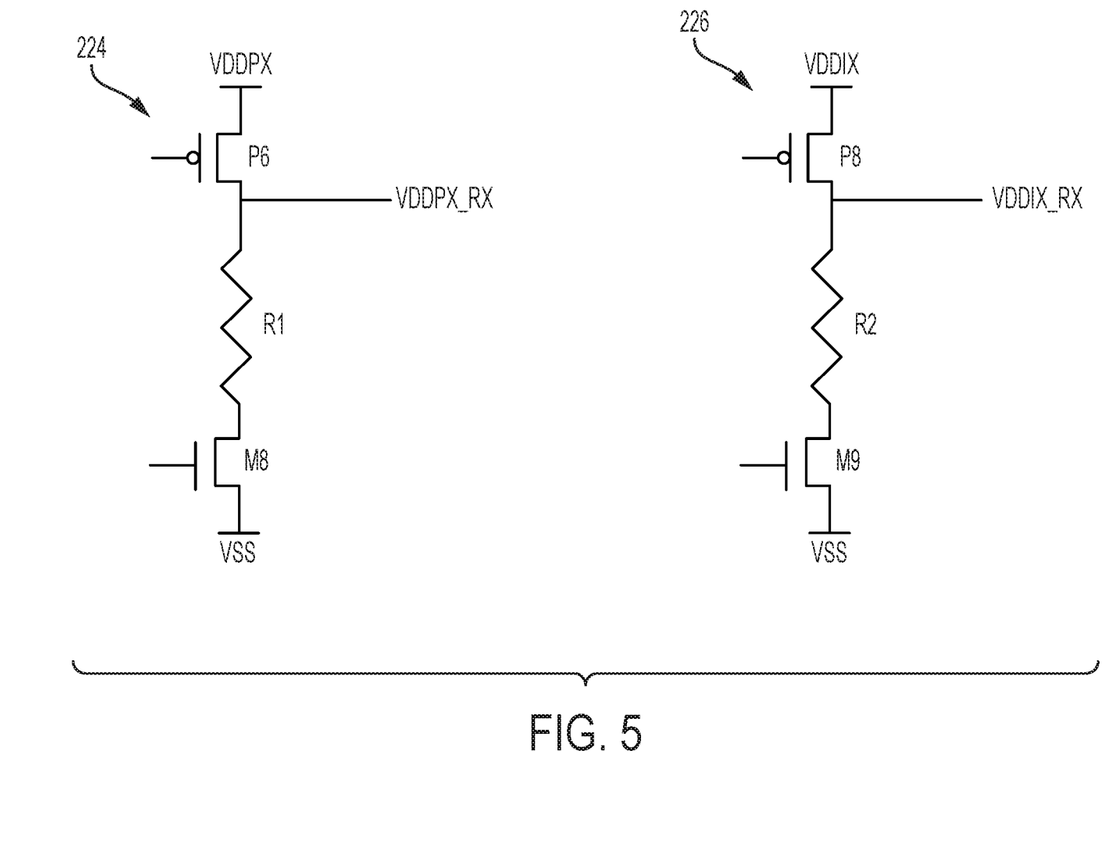
FIG. 5 is a diagram showing an embodiment of dynamic supply shifters.

FIG. 5 is a diagram showing additional detail of one embodiment of dynamic supply shifters 224 and 226. As shown in FIG. 5, VDDPX dynamic supply shifter 224 generates VDDPX_RX and VDDIX dynamic supply shifter 226 generates VDDIX_RX that are coupled to HV receiver 220. VDDPX dynamic supply shifter 224 includes a first transistor P6 and a second transistor M8. The source of P6 is coupled to VDDPX and the drain of P6 is coupled to high voltage input receiver 220 and a first resistor R1 that is coupled to a drain of M8. A source of M8 is coupled to VSS. VDDIX dynamic supply shifter 226 includes a third transistor P7 and a fourth transistor M9. The source of P7 is coupled to VDDIX and the drain of P7 is coupled to high voltage input receiver 220 and a second resistor R2 that is coupled to a drain of M9. A source of M9 is coupled to VSS. The gates of P6, M8, P7, and M9 are coupled to logic (not shown) that controls operation of the transistors. In another embodiment, the dynamic supply shifting logic can be external to the dynamic supply shifters 224 and 226.

During steady state operation of the receiver as illustrated in FIGS. 2, P6 and P7 are on and M8 and M9 are off so that VDDPX is coupled to VDDPX_RX of the high voltage level receiver 220 and VDDIX is coupled to VDDIX_RX of the high voltage input receiver 220.

During a low-to-high transition, when the low voltage input receiver 222 signal goes high, indicating that the I/O signal is beginning a low to high transition M8 and M9 are turned on and current flows through R1 and R2 setting up a voltage divider circuit to set VDDPX_RX and VDDIX_RX to desired levels below VDDPX and VDDIX respectively. Reducing both voltages keeps the maximum voltage difference devices are exposed to below the maximum for the device. The lower voltage gives more headroom for the high voltage input receiver 220 to switch high. When the high voltage input receiver 220 switches high, M9 is turned off preventing current flow through R2 and VDDIX_RX equals VDDIX. The output of high voltage input receiver 220 is coupled to a latch (not shown), so even if high voltage input receiver 220 temporarily switched back to low when VDDIX_RX increases to VDDIX, the latched output remains high. As the I/O signal continues to increase, high voltage input receiver replica 228 will switch high. When high voltage input receiver replica 614 switches high, M8 is turned off, no current flows through R1 and VDDPX_RX equals VDDPX. In another embodiment, M9 is not turned off until high voltage input receiver replica 614 switches high when both VDDIX_RX and VDDPX_RX are set equal VDDIX and VDDPX, respectively, at the same time.

In other embodiments, there are be multiple supplies, or sources of voltage, that are switched to HV receiver circuit 220. An aspect is that you adjust the voltage during the low to high transition to ensure there is enough headroom to account for variations in the threshold voltage level of devices in the HV receiver 220.

Referring back to FIG. 2, a logic circuit 240 compares the binary states of the RX_P and RX_N input signals as discussed below to produce a low power domain output signal 245 that cycles between VSS and VDDIX. Although low power domain output signal 245 is an output signal with regard to input receiver 200, it would be received as an input signal by other components (not illustrated) in the low power domain. For example, low power domain output signal 245 may be received by a processor or other suitable low power domain component.

Figure 6:
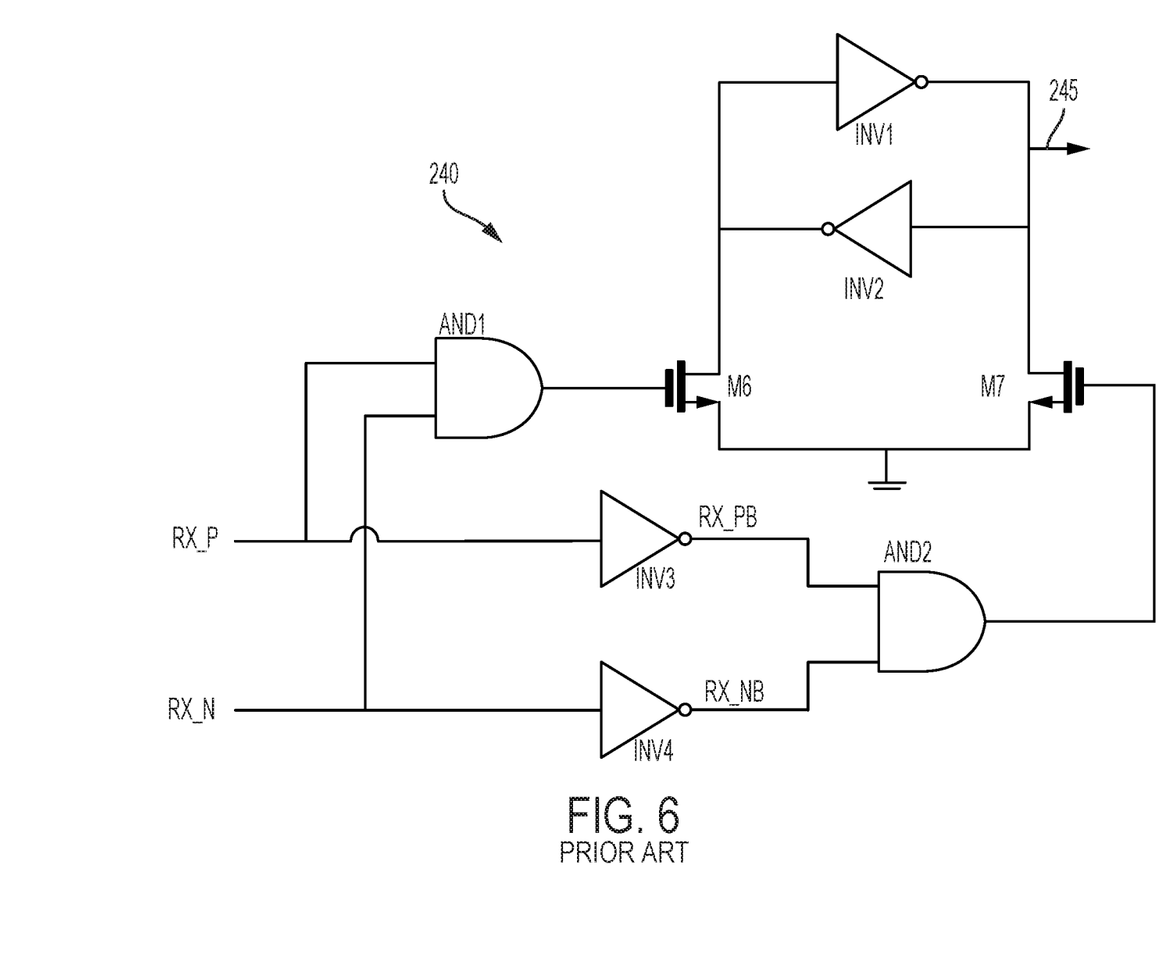
FIG. 6 is a diagram of an embodiment of logic circuit.

FIG. 6 is a diagram of an embodiment of logic circuit 240. A current value for low power domain output signal 245 (its current binary state) is latched using a pair of cross-coupled inverters INV1 and INV2. In particular, low power domain output signal 245 is produced by inverter INVI. The binary state of low power domain output signal 245 is controlled by an NMOS pull down transistor M6 and an NMOS pull down transistor M7. Pull down transistor M6 has its drain coupled to the output of inverter INV2 and its source coupled to ground. Similarly, pull down transistor M7 has its drain coupled to the output of inverter INV1. Should pull down transistor M7 be switched on while pull down transistor M6 is switched off, low power domain output signal 245 is grounded. Conversely, low power domain output signal 245 is charged to VDDIX when pull down transistor M7 is switched off and pull down transistor M6 switched on. To control this complementary switching of pull down transistors M6 and M7, logic circuit 240 may include an AND gate AND1 and an AND gate AND2. AND gate AND1 receives the RX_P and RX_N input signals to drive the gate of pull down transistor M6. If both the RX_P and RX_N input signals have transitioned to a binary high state, pull down transistor M6 is switched on to ground the input to inverter INV1 to cause low power domain output signal 245 to be charged to VDDIX. An inverter INV3 inverts the RX_P input signal into an inverted input signal RX_PB. Similarly, an inverter INV4 inverts the RX_N input signal into an inverted input signal RX NB. AND gate AND2 receives these inverted input signals. Thus, if both the RX_P and RX_N input signals are a binary zero, pull down transistor M7 is switched on to discharge low power domain output signal 245. Note that the remaining binary combinations for the RX_P and RX_N input signals (one being a binary zero, the other being a binary one) do not affect the binary state of low power domain output signal 245. The resulting operation may be summarized in table 1

TABLE 1

| RX_P | RX_N | Output Signal |
|---|---|---|
| 0 | 0 | Receiver will output 0 |
| 0 | 1 | Hold current output state |
| 1 | 0 | Hold current output state (note that this state will not occur in normal operation) |
| 1 | 1 | Receiver will output 1 |

Figure 7:
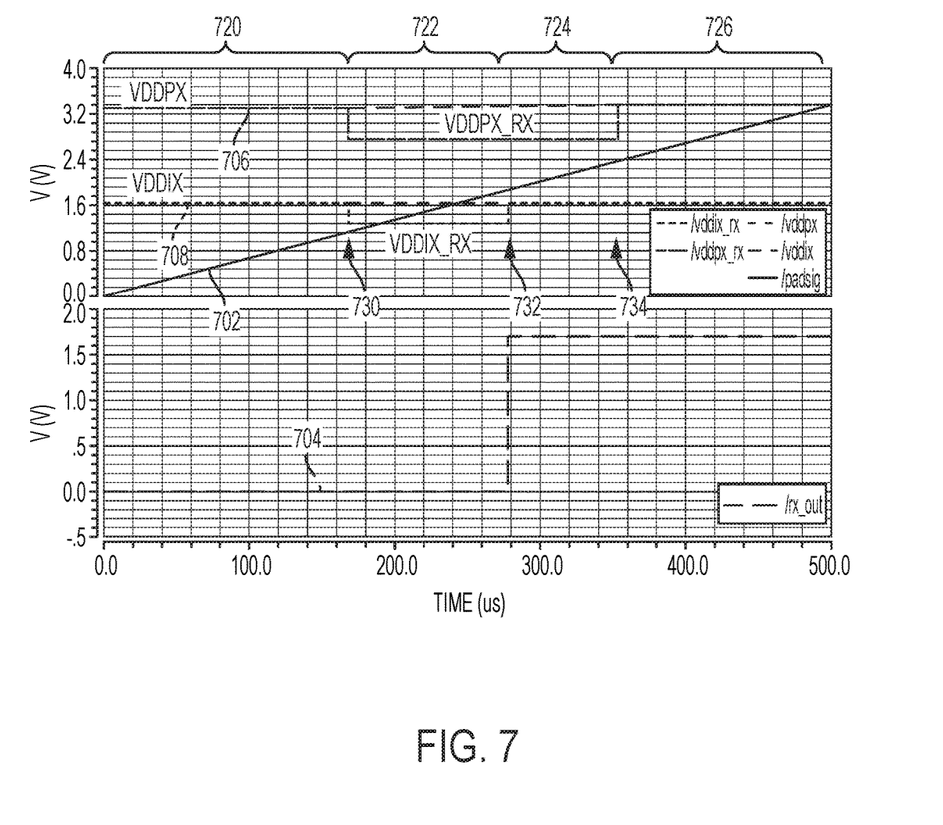
FIG. 7 is a diagram illustrating aspects of dynamically adjusting the supply voltages applied to a high voltage input receiver.

FIG. 7 is a diagram illustrating aspects of dynamically adjusting the supply voltages applied to high voltage input receiver 220. FIG. 7 illustrates a portion of an input signal 702 coupled to the input terminal 210 of the receiver 200 and an output signal 704 from the logic circuit 240 of the receiver 200. The voltage levels VDDPX_RX and VDDIX_RX, 706 and 708 respectively are also shown.

As shown in FIG. 7, during a first period 720 the input signal 702 is low, the output sign 704 is low and VDDPX_RX 706 is at a level equal to VDDPX and VDDIX_RX 708 is at a level equal to VDDIX. As the voltage level of the input signal 702 increase, it reaches a voltage level 730 where the low voltage input receiver 222 output switches to high. When the low voltage input receiver 222 output goes high, indicating that the I/O signal is beginning a low to high transition, VDDPX_RX 706 and VDDIX_RX 708 are adjusted to lower voltage levels. VDDPX_RX 706 and VDDIX_RX 708 remain at these reduced levels during a period 722 while the low voltage input receiver 222 output is high and the high voltage input receiver 220 output is low.

As the input signal 702 continues to increase, it reaches a voltage level 732 where the high voltage input receiver 220 output goes high. It is noted that the output of the high voltage input receiver replica 228 output is still low because it is powered from VDPPX and VDPPIX. When the high voltage input receiver 220 output goes high VDDPX_RX 706 remains at a lower voltage level and VDDIX_RX 708 is adjusted to VDDIX. VDDPX_RX 706 remain at these levels during a period 724 while the low voltage input receiver 222 output and high voltage input receiver 220 output are high and, and the high voltage input replica 228 output is low.

As the input signal 702 continues to increase, it reaches a voltage level 734 where the high voltage input receiver replica 228 output goes high. When the high voltage input receiver replica 228 output goes high VDDPX_RX is adjusted to VDDPX and VDDIX_RX 708 remains at VDDIX. VDDPX_RX 706 and VDDIX_RX 708 remain at these levels during a period 726 until there is another low to high transition of the input signal 702.

Figure 8:
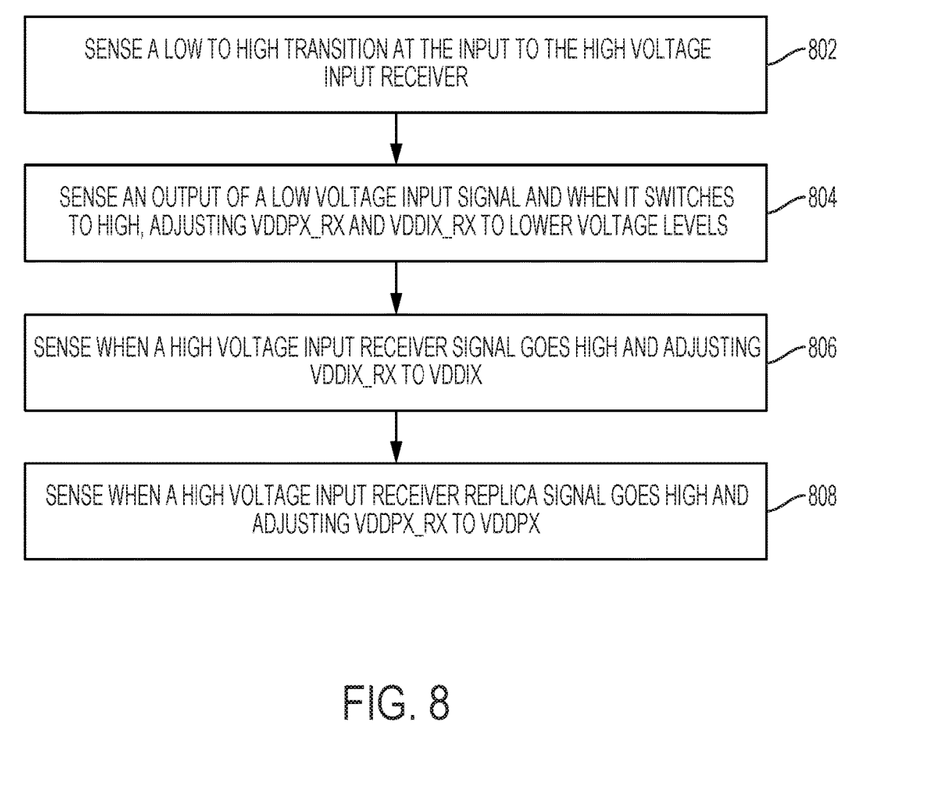
FIG. 8 is a flow chart of adjusting, or shifting, the supply voltages applied to high voltage input receiver The drawings may not depict all components of a particular apparatus, structure, or method. Further, like reference numerals denote like features throughout the specification and figures.

FIG. 8 is a flow chart of adjusting, or shifting, the supply voltages applied to high voltage input receiver. Flow begins in block 802 where a low to high transition is sensed at the input to the high voltage input receiver.

Flow continues to block 804 where an output of a low voltage input receiver 222 output is sensed, and when it switches to high VDDPX_RX and VDDIX_RX are adjusted to lower voltage levels. Flow continues to block 806 where a high voltage input receiver 220 output is sensed, and when it goes high VDDIX_RX is adjusted to VDDIX. Flow continues to block 808 where a high voltage input receiver replica 228 output is sensed, and when it goes high VDDPX_RX is adjusted to VDDPX.

The various illustrative logical blocks, modules, and circuits described in connection with the aspects disclosed herein may be implemented or performed in an integrated circuit (IC), a system on a chip (SoC), an Application Specific Integrated Circuit (ASIC), a Field Programmable Gate Array (FPGA) or other programmable logic device, discrete gate or transistor logic, discrete hardware components, or any combination thereof designed to perform the functions described herein.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An input receiver for receiving a high power domain input signal from a high power domain powered by a high power supply voltage, wherein the input receiver is within a low power domain powered by a low power supply voltage, comprising:
   a waveform splitter configured to split the high power domain input signal into a high voltage signal that is greater than or equal to the low power supply voltage and into a low voltage signal that is less than or equal to the low power supply voltage, wherein the high power supply voltage is greater than the low power supply voltage;
   a low voltage input receiver coupled to the low voltage signal, the low voltage input receiver powered by the low power supply voltage and ground;
   a high voltage input receiver coupled to the high voltage signal, the high voltage receiver powered by the high power supply voltage and the low power supply voltage;
   a high voltage input receiver replica coupled to the high voltage signal, the high voltage input receiver replica powered by the high power supply voltage and low power supply voltage;
   wherein, the high power supply voltage and low power supply voltage of the high voltage receiver are shifted to lower voltage levels when an output of the low voltage input receiver goes high;
   the low power supply voltage of the high voltage receiver is increased to the low power supply voltage level when an output of the high voltage input receiver goes high; and
   the high power supply voltage of the high voltage receiver is increased to the high power supply voltage level when an output of the high voltage input receiver replica output goes high.

2. The input receiver of claim 1, wherein the high power domain is an I/O power domain and the high power supply voltage is an I/O power supply voltage, and wherein the low power domain is a core power domain and the low power supply voltage is a core power supply voltage.

3. The input receiver of claim 1, wherein the high power domain is a first I/O power domain and the high power supply voltage is a first I/O power supply voltage, and wherein the low power domain is a second I/O power domain and the low power supply voltage is a second I/O power supply voltage.

4. The input receiver of claim 1, wherein the high voltage input receiver comprises an inverter including a PMOS transistor in series with an NMOS transistor, and wherein a source of the NMOS transistor is coupled to a low power supply node for supplying the low power supply voltage and wherein a source of the PMOS transistor is coupled to a high power supply node for supplying the high power supply voltage.

5. The input receiver of claim 1, wherein the low voltage input receiver comprises an inverter including a PMOS transistor in series with an NMOS transistor, and wherein a source of the NMOS transistor is coupled to ground and wherein a source of the PMOS transistor is coupled to a low power supply node for supplying the low power supply voltage.

6. An input receiver for receiving a high power domain input signal from a high power domain powered by a high power supply voltage, wherein the input receiver is within a low power domain powered by a low power supply voltage, comprising:
   a waveform splitter configured to split the high power domain input signal into a high voltage signal that is greater than or equal to the low power supply voltage and into a low voltage signal that is less than or equal to the low power supply voltage, wherein the high power supply voltage is greater than the low power supply voltage;
   a low voltage input receiver coupled to the low voltage signal, the low voltage input receiver powered by the low power supply voltage and ground;
   a dynamic high power supply shifter coupled to the high voltage power supply voltage and configured to output a shifted high power supply voltage;
   a dynamic low power supply shifter coupled to the low voltage power supply voltage and configured to output a shifted low power supply voltage;
   a high voltage input receiver coupled to the high voltage signal, the high voltage receiver powered by the shifted high power supply voltage and the sifted low power supply voltage;
   a high voltage input receiver replica coupled to the high voltage signal, the high voltage input receiver replica powered by the high power supply voltage and low power supply voltage;
   wherein, the shifted high power supply voltage and shifted low power supply voltage are shifted to lower voltage levels when an output of the low voltage input receiver goes high;
   the shifted low power supply voltage receiver is increased to the low power supply voltage level when an output of the high voltage input receiver goes high; and
   the shifted high power supply voltage is increased to the high power supply voltage level when an output of the high voltage input receiver replica output goes high.

7. The input receiver of claim 6, wherein the high power domain is an I/O power domain and the high power supply voltage is an I/O power supply voltage, and wherein the low power domain is a core power domain and the low power supply voltage is a core power supply voltage.

8. The input receiver of claim 6, wherein the high power domain is a first I/O power domain and the high power supply voltage is a first I/O power supply voltage, and wherein the low power domain is a second I/O power domain and the low power supply voltage is a second I/O power supply voltage.

9. The input receiver of claim 6, wherein the high voltage input receiver comprises an inverter including a PMOS transistor in series with an NMOS transistor, and wherein a source of the NMOS transistor is coupled to a low power supply node for supplying the low power supply voltage and wherein a source of the PMOS transistor is coupled to a high power supply node for supplying the high power supply voltage.

10. The input receiver of claim 6, wherein the low voltage input receiver comprises an inverter including a PMOS transistor in series with an NMOS transistor, and wherein a source of the NMOS transistor is coupled to ground and wherein a source of the PMOS transistor is coupled to a low power supply node for supplying the low power supply voltage.

11. The input receiver of claim 6, wherein the low power supply voltage is about half the level of the high power supply voltage.

12. The input receiver of claim 6, where in the dynamic high power supply shifter comprises a voltage divider.

13. The input receiver of claim 6, where in the dynamic high power supply shifter comprises multiple power supplies.

14. The input receiver of claim 6, where in the dynamic low power supply shifter comprises a voltage divider.

15. The input receiver of claim 6, where in the dynamic low power supply shifter comprises multiple power supplies.

16. A method of converting a high power domain input signal from a high power domain powered by a high power supply voltage into an output signal for a low power domain powered by a low power supply voltage, comprising:
   splitting the high power domain input signal into a high voltage signal that cycles between the low power supply voltage and the high power supply voltage and into a low voltage signal that cycles no greater than the low power supply voltage, wherein the high power supply voltage is greater than the low power supply voltage;
   coupling the low voltage signal to a low voltage input receiver, the low voltage receiver powered by the low power supply voltage and ground;
   coupling the high voltage signal to a high voltage input receiver, the high voltage receiver powered by the high power supply voltage and the low power supply voltage;
   adjusting the high power supply voltage and low power supply voltage, of the high voltage receiver, to lower voltage levels when an output of the low voltage input receiver goes high;
   adjusting the low power supply voltage, of the high voltage receiver, to the low power supply voltage level when an output of the high voltage input receiver goes high; and
   adjusting the high power supply voltage, of the high voltage receiver, to the high power supply voltage level when an output of a high voltage input receiver replica output goes high, the high voltage input receiver replica coupled to the high voltage signal and powered by the high power supply voltage and low power supply voltage.

17. The method of claim 16, wherein the high power domain is an I/O power domain and the high power supply voltage is an I/O power supply voltage, and wherein the low power domain is a core power domain and the low power supply voltage is a core power supply voltage.

18. The method of claim 16, wherein the high power domain is a first I/O power domain and the high power supply voltage is a first I/O power supply voltage, and wherein the low power domain is a second I/O power domain and the low power supply voltage is a second I/O power supply voltage.

19. The method of claim 16, wherein the low power supply voltage is about half the level of the high power supply voltage.

20. The method of claim 16, wherein adjusting the low power supply voltages comprises a voltage divider to lower a voltage.

21. The method of claim 16, wherein adjusting the high power supply voltage comprises a voltage divider to lower a voltage.

22. A apparatus of converting a high power domain input signal from a high power domain powered by a high power supply voltage into an output signal for a low power domain powered by a low power supply voltage, comprising:
   means for splitting the high power domain input signal into a high voltage signal that cycles between the low power supply voltage and the high power supply voltage and into a low voltage signal that cycles no greater than the low power supply voltage, wherein the high power supply voltage is greater than the low power supply voltage;
   means for coupling the low voltage signal to a low voltage input receiver, the low voltage receiver powered by the low power supply voltage and ground;
   means coupling the high voltage signal to a high voltage input receiver, the high voltage receiver powered by the high power supply voltage and the low power supply voltage;
   means for adjusting the high power supply voltage and low power supply voltage, of the high voltage receiver, to lower voltage levels when an output of the low voltage input receiver goes high;
   means for adjusting the low power supply voltage, of the high voltage receiver, to the low power supply voltage level when an output of the high voltage input receiver goes high; and
   means for adjusting the high power supply voltage, of the high voltage receiver, to the high power supply voltage level when an output of a high voltage input receiver replica output goes high, the high voltage input receiver replica coupled to the high voltage signal and powered by the high power supply voltage and low power supply voltage.

* * * * *